Aug. 12, 1958 J. A. WORCESTER 2,847,564

VOLUME CONTROL CIRCUIT FOR A CLOCK RADIO

Filed Oct. 13, 1955

Inventor:
Joseph A. Worcester,
by Donald N. Timbie
His Attorney.

United States Patent Office 2,847,564

Patented Aug. 12, 1958

2,847,564

VOLUME CONTROL CIRCUIT FOR A CLOCK RADIO

Joseph A. Worcester, Syracuse, N. Y., assignor to General Electric Company, a corporation of New York Application October 13, 1955, Serial No. 540,244

4 Claims. (Cl. 250—20)

Figures 1, 2:
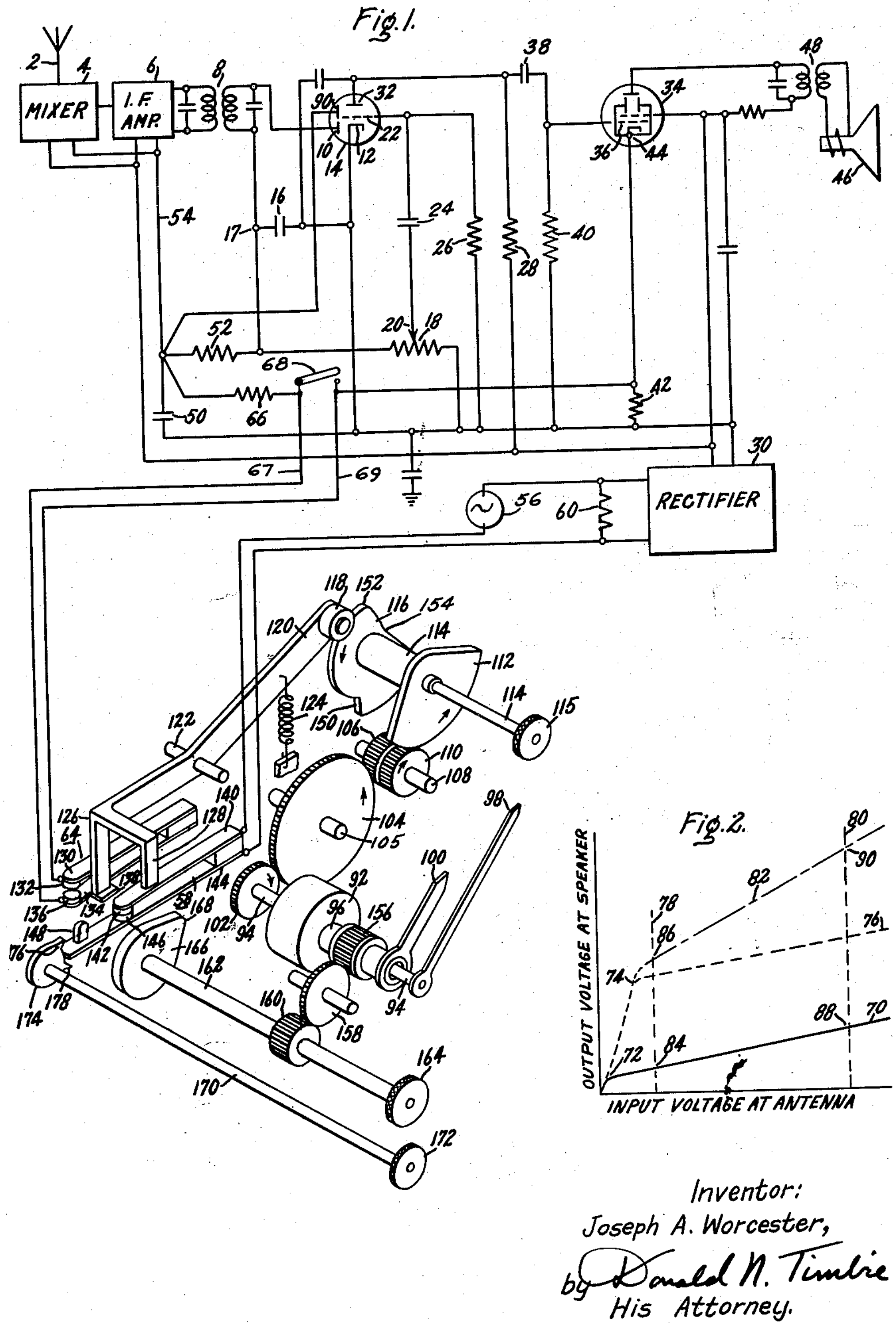

This invention relates to an improved control circuit for a clock radio or time-controlled radio receiver.

In some clock radios, means are provided for turning the radio off at a predetermined time and turning it on with increased volume at a later time. The radio is turned on and off by a power switch located between the alternating-current power supply and the rectifier that provides direct-current operating voltages for the radio. Changes in the volume setting have been effected by a muting switch that operates to produce a change in the circuitry connected with the audio amplifier. Most of the timing apparatus is of such structure as to operate the switches simultaneously. Unfortunately, the direct-current power supply retains its output voltage for a little while after the power switch is opened so that the radio is still in an operating condition and any sudden increase in volume such as that produced by the operation of the muting switch causes a sudden increase in the audio output. In some cases a loud click is heard and in others the audio level is increased for a few moments.

Accordingly, it is an object of this invention to provide an improved switching system for a radio receiver whereby the radio may be shut off and a higher volume setting simultaneously established for subsequent operation without producing a sudden increase in the audio output.

Briefly, one way of achieving this objective is to effect the desired change in volume by connecting the muting switch in such manner that a delay voltage is applied to the automatic volume control circuit. As is well known by those skilled in the art, the provision of delay voltage to an automatic gain control circuit reduces the effective automatic gain control voltage and increases the gain of the receiver so that the audio output is increased. However, owing to the rather long time constant of the automatic gain control circuit, this increase in the gain of the receiver takes place slowly. Hence, when the power switch cuts off the supply of alternating-current voltage to the rectifier, the receiver gain does not increase by a noticeable amount while the voltages supplied by the rectifier are sufficient to keep the receiver in operation.

Whereas the application of a delay voltage to the automatic gain control circuit has the advantages noted above, it generally results in variations in the ratio of the volume change for different strengths of received signals.

Therefore, it is another object of this invention to apply a delay voltage to an automatic gain control circuit in such manner as to change the gain of a receiver by the same ratio irrespective of the gain of the receiver prior to the application of the delay voltage.

Briefly, the latter objective can be achieved by applying the delay voltage through a resistive impedance of the proper value.

The manner in which these objectives may be attained in accordance with the principle of this invention will be better understood after the following detailed explanation of the drawings in which:

Figure 1 is a schematic diagram illustrating an embodiment of the invention; and Figure 2 is a graph useful in explaining the operation of Figure 1.

The conventional portion of the receiver of Figure 1 is as follows. The received radiations are gathered by an antenna 2, reduced to an intermediate frequency by a mixer 4 and suitably amplified by an amplifier 6. A transformer 8 serves to couple the output of the I. F. amplifier 6 across a detector diode formed by an anode 10 and a grounded cathode 12 of an electron discharge device 14. The useful signal output of the detector appears at point 17 on the left side of a capacitor 16. A volume control potentiometer 18 is connected between the point 17 and ground, its moveable tap 20 being connected to a control electrode 22 of an amplifier section of the device 14 via a coupling capacitor 24 and a grid-leak resistor 26. The amplified signal is developed across a load resistor 28 that is connected between a positive terminal of a rectifier power supply 30 and an anode 32 of the amplifier section of the device 14. The signal is further amplified by a power amplifier 34 having a control electrode 36 coupled to the anode 32 by a coupling capacitor 38 and a grid-leak resistor 40. A bias resistor 42 is connected between a cathode 44 and ground. The output of the amplifier 34 is coupled to a utility device such as a speaker 46 in any suitable manner as by a transformer 48. A capacitor 50 is connected in series with a smoothing resistor 52 and this series combination is then connected between ground and any suitable point such as point 17, where the useful detected signal is available. The circuit, consisting of capacitor 50 and resistor 52, forms what can be described as an integration network, or more commonly what is known as an RC circuit which will give a time constant. The normal automatic gain control voltage is developed across capacitor 50, and a lead 54 serves as an automatic volume control bus connecting the automatic volume control voltage to the control electrodes (not shown) of mixer 4 and I. F. amplifier 6. An anode 90 of a diode formed in device 14 by anode 90 and a cathode 12 is connected to the automatic control bus 54 to prevent the automatic gain control bus from going positive during reception of weak signals. During weak signals, the positive signal from device 34 will cause conduction of the diode formed by anode 90 and cathode 12.

As usual, a source of alternating-current potential 56 is connected via a power switch 58 to the rectifier power supply 30 and to the filaments 60 of the various electron discharge devices of the receiver.

In accordance with the present invention, a resistive impedance 66 is connected in series with the muting switch 64 between the automatic gain control bus 54 and a point of suitable positive delay voltage such as the cathode 44 of the output amplifier 34. A manually operated switch 68 may be connected in parallel with the muting switch if desired. Obviously this switch can be connected at any point between lines 67 and 69.

The operation of the circuit is as follows. Assume that the power switch 58 is closed and that the receiver is operating. If the muting switch 64 is open, full automatic gain control voltage will be applied to the mixer 4 and the amplifier 6 resulting in reduced output or volume. However, if the muting switch 64 is closed, the positive voltage appearing at the cathode 44 is applied via the resistor 66 to the automatic gain control bus 54. The time constant of the automatic gain control circuit as determined by capacitor 50 and resistor 66 prevents any sudden increase in the audio output of the receiver. Actually, the delay voltage applied to bus 54 is reduced to a fraction of the voltage at cathode 44, this fraction being the ratio of the sum of the resistances of the resistor 52 and the potentiometer 18 to the total resistance of the resistors 52 and 66 and the resistance of the potentiometer 18. At the same time, the automatic gain control voltage that would otherwise appear at the bus 54 is reduced by a fraction equal to the ratio of the resistance of the resistors 66 and 42 to the total resistance of the resistors 52, 66 and 42. The negative automatic gain control voltage at the bus 54 has to equal the positive delay voltage before any reduction in the gain of the receiver may be effected.

Figure 2 is a series of graphs indicating the relationship between the output voltage at the speaker to the input voltage at the antenna under various conditions. Curve 70 illustrates the condition prevailing with the standard automatic gain control circuit, i. e., with the switches 64 and 68 open. It will be noted that for very small input voltages the characteristic is linear. At point 72, the amplitude of the received signal is sufficient to develop appreciable detector diode voltage and the resulting automatic gain control voltage levels off the output characteristic as shown. A substantial increase in volume may be obtained by applying positive voltage to the automatic gain control bus 54 so that the application of automatic gain control voltage is delayed until the strength of the received signal is as indicated at point 74. As the signal strength increases, the output would be as indicated by the dotted line 76 if the voltage divider networks of this invention were not employed. The disadvantage of increasing the gain by application of the positive delay voltage alone is that the ratio of the output changes between curves 76 and 70 is considerably greater at a signal strength 78 than at a signal strength 80.

In order to maintain the ratio of gain changes constant, regardless of the received signal strength, it is necessary to apply only part of the automatic gain control voltage to the bus 54 in order to increase the slope of the output vs. input characteristic as indicated by the curve 82. The slope of the curve is determined by the ratio of the resistance of the resistor 66 to the sum of the resistances of the resistors 66 and 52 and, therefore, the slope can be adjusted so that the ratio of the ordinate values at points 84 and 86 is the same as the ratio of the ordinate values at the points 88 and 90.

Although other values may be used, the following component values worked very well in one receiver:

| | | |
|---|---|---|
| R66 | megohms | 1.5 |
| R52 | do | 2.2 |
| Potentiometer 18 | do | 0.75 |
| R42 | ohms | 150 |
| C50 | M. F. | .05 |

It is desirable that means be provided for opening the manually closed muting switch 64 and closing the normally open power switch 58 for a predetermined time and also that means be provided for automatically closing the power switch 58 at a preselected time. When such means are provided, it is possible for the radio to operate at a reduced gain for a predetermined time during the evening and to turn on with normal gain the next morning. The following description relates to one of various mechanisms for providing for such automatic operation of the power switch 58 and the muting switch 64. For ease in illustration, the bearings for the various gear shafts are not shown. A clock motor 92 contains a shaft 94 that rotates once during each hour and a surrounding shaft 96 that rotates once every twelve hours. A minute hand 98 may be attached to the inner shaft 94 and an hour hand 100 may be attached to the outer shaft 96. A gear 102 is secured to the shaft 94 so as to rotate with the shaft. An idler gear 104 is mounted for rotation on shaft 105 and is meshed with the gear 102. Another gear 106 is firmly secured to a shaft 108 and is meshed with the idler gear 104 so that the shaft 108 and the gear 106 rotate as a unit. A gear 110 is mounted on the shaft 108 in such manner as to provide a slip clutch, i. e., the gear 110 may rotate with respect to the shaft 108 under the application of a given torque. A sector gear 112 is firmly secured to a shaft 114 and is meshed with the slip clutch gear 110. A knob 115 is secured to one end of the shaft 114 and a cam 116 is firmly secured to the other end. The outer periphery of the cam 116 engages a cam follower 118 that is mounted on one end of a lever 120 which is pivoted at a point 122. The lever 120 is urged in a clockwise direction by a tension spring 124 so that the cam follower 118 always maintains contact with the periphery of the cam 116. At the other end of the lever 120 are two switch-actuating arms 126 and 128.

The muting switch 64 is comprised of a stiff cantilever member 130 having a contact 132 mounted at the free end and a flexible cantilever member 134 having a contact 136 mounted at its free end. A projection 138 is located on the flexible member 134 at a point where it can be engaged by the switch-actuating arm 126.

The power switch 58 is comprises of an upper flexible cantilever member 140 having an electrical contact 142 at its free end and a lower flexible cantilever member 144 of magnetic material having an electrical contact 146 mounted at an intermediate point. The upper member 140 is positioned so as to be engaged by the switch-actuating arm 128. A magnet 148 is positioned above the free end of the member 144. The strength of the magnet 148 and its distance from the member 144 are such that the member 144 retains a spaced relation between the contacts 142 and 146 unless it is urged a given amount toward the magnet 148 at which point the magnet 148 attracts the member 144 sufficiently to close the contacts 142 and 146.

The operation of the mechanism thus far described is as follows. In order to operate the radio for a maximum time at reduced volume, the knob 115 is turned in a clockwise direction until a shoulder 150 on the cam 116 bears against the cam follower 118. The effective radii of the gears 102, 106, 110 and 112 is such that the sector gear 112 is driven in a given time to a point where it no longer engages the gear 110, for example, in one hour. If the time for reduced volume operation is to be less than an hour, the knob 115 is not turned as much. During most of the time when the sector gear is being rotated, the cam follower 118 rides on a large radius portion of the cam 116 so that the lever 120 is pivoted in a counter-clockwise direction. This results in an opening of the contacts 132 and 136 of the muting switch 64 and a closing of the contacts 142 and 146 of the power switch 58 so that the radio is operated at a reduced gain. Just before the sector gear 112 reaches the end of its engagement with the gear 110, the cam follower 118 reaches a point 152 on the cam 116 and during the remaining rotation of the sector gear 112, the cam follower 118 reaches a point of reduced radius such as 154 on the cam 116. This permits the lever 120 to rotate clockwise thus causing the member 134 to spring upwards until the muting switch is closed and causing the member 140 to spring upward until the power switch is open. Hence, the mechanism is a means for operating the radio at a reduced gain for a predetermined time.

The following portion of the mechanism operates to turn the radio on at a given time. A gear 156 is mounted on the shaft 96 in such manner as to constitute a slip clutch, i. e., it rotates with respect to the shaft upon application of a given torque. An idler gear 158 is meshed with the slip clutch gear 156 and a gear 160 that is securely mounted on a shaft 162. At one end of the shaft is a knob 164 and at the other end is a cam 166 having a high point or projection 168. The gears 156, 160, the shaft 162 and the cam 166 rotate once every twelve hours. If the contacts 142, 146 of the power switch 58 are open, contact between the projection 168 and the underside of the member 144 cause the member 144 to be raised to a point where the magnet 148 can attract the member 144 and bring the contacts 142, 146 together, thus supplying power to the set. However, the muting switch 64 remains open so that the radio operates at normal gain. The time at which this occurs can be determined by adjusting the position of the cam 166 with respect to the shaft 96. This can be done by turning the knob 164. The friction in the slip clutch formed by the gear 156 is such that it can be rotated with respect to the shaft 96 by the knob 164 and yet not slip when it is driving the gear 160 by action of the motor 92. In order to prevent the radio from being turned on once every twelve hours, the shaft 162 is mounted so that it can be moved axially, thus permitting the cam 166 to be moved to a position where it cannot make contact with the member 144 of the power switch. Hence, means are provided for closing the power switch and applying power to the radio at a given preselected time.

In order to open and close the power switch 58 manually, there is provided a shaft 170 having a knob 172 on one end and a cam 174 on the other. Two spaced pawls 176 and 178 are mounted on the periphery of the cam, one lying above the end of the member 144 and the other below so that when the knob 172 is rotated counter-clockwise, the power switch 58 is closed and when it is rotated clockwise, the switch is opened.

An anode 90 of a diode formed in the device 14 by the anode 90 and the cathode 12 is connected to the automatic gain control bus 54 so as to prevent the bus 54 from going positive, but this does not form a part of the invention.

While I have illustrated a particular embodiment of my invention, it will of course be understood that I do not wish to be limited thereto, since various modifications, both in the circuit arrangement and in the instrumentalities, may be made and I contemplate by the appended claims to cover any such modifications as fall within the true spirit and scope of the invention.

What I claim as new and desire to secure by Letters Patent of the United States is:

1. In a receiver, the combination of an automatic gain control circuit having a bus upon which the automatic gain control voltage appears, a point of positive direct-current potential, a muting switch, a resistive impedance connected in series between said point and said automatic gain control bus, a power switch for energizing said receiver, and a timer having means for closing said muting switch and opening said power switch for a first predetermined period, and for closing said power switch after a second predetermined period.

2. In a receiver, the combination of means for deriving a negative voltage having an amplitude that varies in accordance with the amplitude variation of an amplitude-modulated carrier wave, said voltage being negative with respect to a point of reference potential, an integration network formed by a first resistor and a capacitor connected in series between the output of said means and said point of reference potential so that the voltage across said capacitor corresponds to the peak amplitude of said amplitude-modulated carrier wave, means for providing a point of potential that is positive with respect to said reference potential, a second resistor, a muting switch, said second resistor and said muting switch being connected in series between said point of positive potential and the junction of said first resistor and said capacitor whereby the amount of the negative voltage component that would appear at said junction is reduced and whereby the junction does not become negative until the reduced negative voltage is equal to the positive voltage applied to said junction, a source of alternating current voltage, a direct current rectifier, a power switch for connecting said alternating current source to said rectifier, connections for applying operating voltages to selected points in said receiver, a timer having means for closing said muting switch and opening said power switch for a first predetermined period, and for closing said power switch after a second predetermined period.

3. In a clock radio, the combination of means for receiving and amplifying an amplitude-modulated wave, an automatic gain control bus connected to said amplifying means, means including a first resistor for applying a negative automatic gain control voltage to said bus, a source of positive potential, a bias resistor connected to said source, a muting switch and a second resistor connected in series between said source of positive potential and said bus whereby the amount of negative automatic gain control voltage that would otherwise appear at said bus may be reduced by the closing of said switch by a fraction equal to the ratio of the sum of the resistance of said second resistor and said bias resistor to the sum of the resistances of said second resistor, said bias resistor and said first resistor, a source of alternating current voltage, a direct current rectifier, a power switch for connecting said source to said rectifier, connections for applying operating voltages to selected points in said receiver, a timer having means for closing said muting switch and opening said power switch for a first predetermined period, and for closing said power switch after a second predetermined period.

4. A radio comprising, in combination, a point of reference potential, means for deriving a signal from an amplitude-modulated carrier wave that is negative with respect to said point of reference potential, a first resistor and a capacitor connected in series in the order named between said means and said point of reference potential, the values of said capacitor and said first resistor being such as to produce at the junction between them a negative voltage corresponding to the peak amplitude of said carrier wave, a source of potential that is positive with respect to said reference potential, a muting switch and a second resistor connected in series between said source of positive potential and the junction, means for controlling the gain of said receiver in accordance with the voltage appearing at the junction, a source of operating voltages for said radio, a power switch connected to said source in such way as to control the application of operating voltages to said radio, means for opening said muting switch and closing said power switch for a predetermined period so that said radio is provided with operating potential and operates at reduced gain during this period, said means also being such as to close said muting switch and open said power switch at the end of the period, and means for closing said power switch at a predetermined time following said period whereby said radio operates at normal gain.

References Cited in the file of this patent

UNITED STATES PATENTS

| | | |
|---|---|---|
| 2,043,582 | Fowler | Mar. 27, 1936 |
| 2,201,162 | Elliott | May 21, 1940 |
| 2,546,401 | Nicholson et al. | Mar. 27, 1951 |